United States Patent [19]
Higuchi

[11] Patent Number: 5,645,864
[45] Date of Patent: Jul. 8, 1997

[54] RESIN ENCAPSULATING MOLDING DIE FOR MANUFACTURING A SEMICONDUCTOR DEVICE

[75] Inventor: Noriaki Higuchi, Tokyo, Japan

[73] Assignee: Mitsubishi Denki Kabushiki Kaisha, Tokyo, Japan

[21] Appl. No.: 639,331

[22] Filed: Apr. 25, 1996

[30] Foreign Application Priority Data

Oct. 23, 1995 [JP] Japan .................................. 7-274202

[51] Int. Cl.⁶ .......................... B29C 45/02; B29C 45/14; B29C 45/37

[52] U.S. Cl. ........................ 425/116; 425/117; 425/121; 425/544; 425/572; 425/588; 425/DIG. 47; 264/272.17

[58] Field of Search ........................ 264/272.17; 425/116, 425/117, 121, 129.1, 544, 588, 572, DIG. 228, 567, 573, DIG. 47; 249/95, 93

[56] References Cited

U.S. PATENT DOCUMENTS

| | | | |
|---|---|---|---|
| 3,659,821 | 5/1972 | Sakamoto et al. | 264/272.17 |
| 5,214,846 | 6/1993 | Asami et al. | 264/272.17 |
| 5,302,101 | 4/1994 | Nishimura | 425/DIG. 228 |

FOREIGN PATENT DOCUMENTS

| | | | |
|---|---|---|---|
| 62-130531 | 6/1987 | Japan | 264/272.17 |
| 3-64035 | 3/1991 | Japan | 264/272.17 |

*Primary Examiner*—Khanh P. Nguyen
*Attorney, Agent, or Firm*—Leydig, Voit & Mayer

[57] ABSTRACT

A resin encapsulating molding die for manufacturing a semiconductor device includes a cavity piece having a cavity on which a lead frame with a mounted semiconductor element may be placed, with the semiconductor element in the cavity, and a gate piece having a gate portion including a sub-runner through which a molten resin for encapsulating the semiconductor element is introduced into the cavity, the gate piece being detachable from the cavity piece. The molding die also includes a sealing dam disposed adjacent the sub-runner for blocking flow of molten resin from the sub-runner toward leads of the lead frame. The sealing dam may be a clamp structure for clamping the leads closest to the gate portion, the sealing dam and cavity piece may be a continuous unitary structure, and the sealing dam may have a parting surface substantially coplanar with a parting surface of the cavity piece.

14 Claims, 8 Drawing Sheets

RESIN ENCAPSULATING MOLDING DIE FOR MANUFACTURING A SEMICONDUCTOR DEVICE

BACKGROUND OF THE INVENTION

This invention relates to a resin encapsulating molding die for manufacturing a semiconductor device for use in encapsulating a semiconductor element within molded resin.

Figure 5:
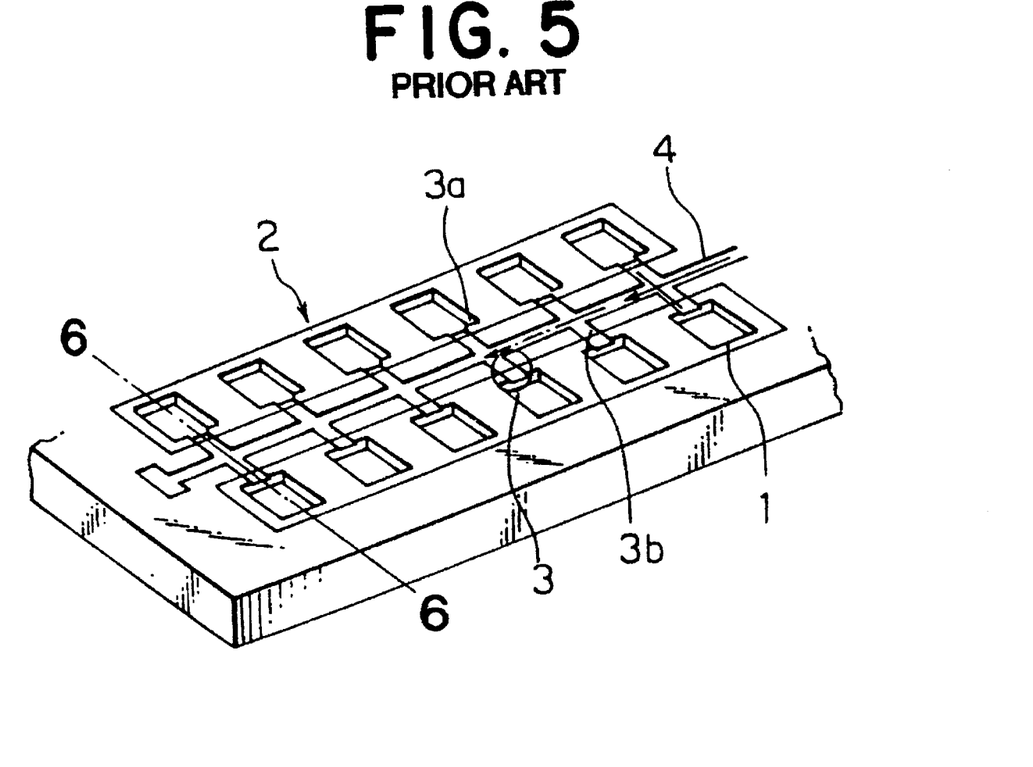
FIG. 5 is a perspective view of a lower die of a conventional resin encapsulating molding die for manufacturing a semiconductor device with a lead frame mounted on the molding die.
Figure 6:
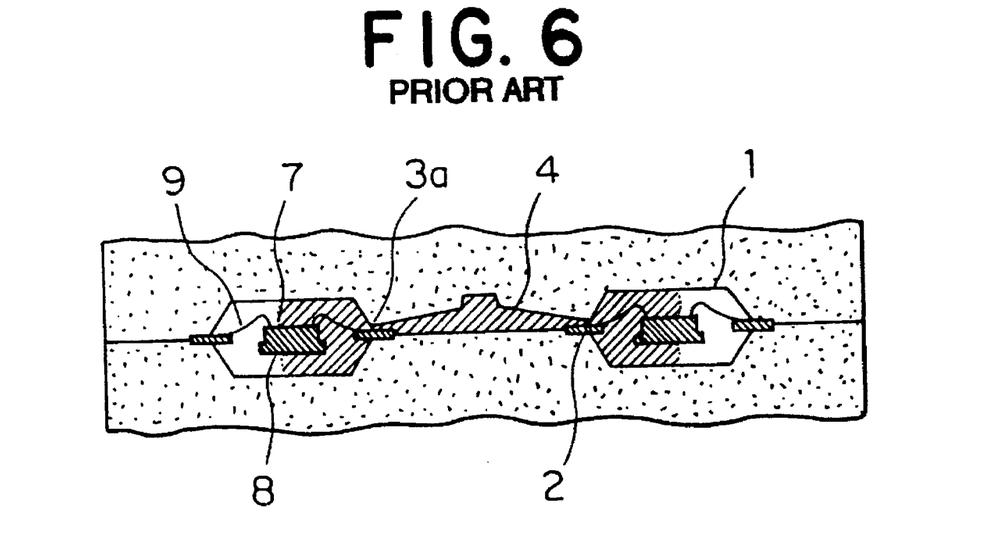
FIG. 6 is a sectional view substantially taken along line 6—6 of FIG. 5, but illustrating the upper and the lower dies with the lead frame having mounted thereon with the semiconductor chips interposed between the dies.

FIG. 5 illustrates one example of a lower molding die of a conventional resin encapsulating die with a lead frame placed thereon and FIG. 6 illustrates in section taken along line X-X' of FIG. 5. In these figures, it is seen that the lower molding die has formed therein a plurality of cavities 1 each connected through a sub-runner 3b to a runner 4 along which the molten encapsulating resin flows into the cavities 1. The sub-runners 3b are branched out from the runner 4 and each has a gate 3a formed in a gate portion 3 of the molding die. It is also seen that a lead frame 2 is placed on the mold die. The lead frame 2 has a plurality of die pads 8 on each of which a semiconductor chips 7 is bonded and electrically connected through gold wires 9. As shown in FIG. 6, the semiconductor chips 7 are positioned within the respective cavities 1 of the molding die.

In the conventional resin encapsulating molding die for manufacturing a semiconductor device as shown in FIGS. 5 and 6 the gate portion 3 and the cavity portion 1 are integral, one piece, or unitary structures. With this type of molding die, when a molding resin which contains a large amount of filler material, such as silica, is used, severe abrasion or wear is experienced at the gate 3, which is an injecting port for the mold resin, posing difficult control problems in melting the molding resin and the incomplete separation from the molding die as well as breakage of the gate occur.

Figure 7:
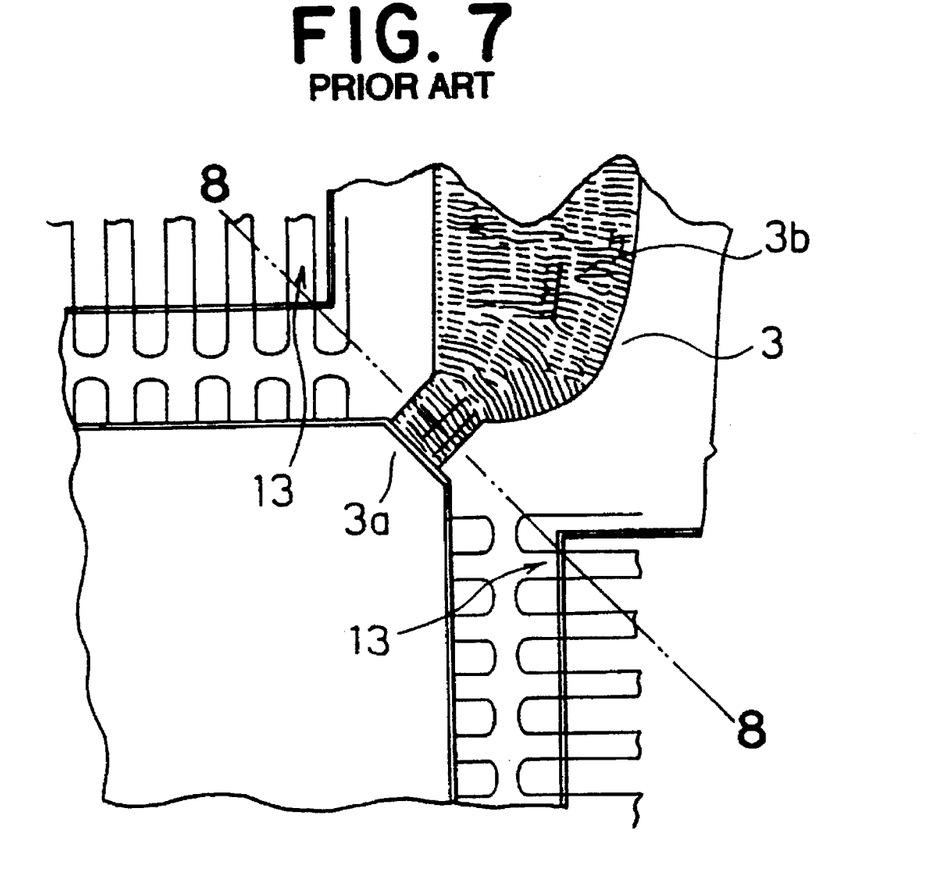
FIG. 7 is a fragmental plan view of the upper die of the conventional resin encapsulating molding die for manufacturing a semiconductor device in which the cavity piece and the gate piece are one piece.
Figure 8:
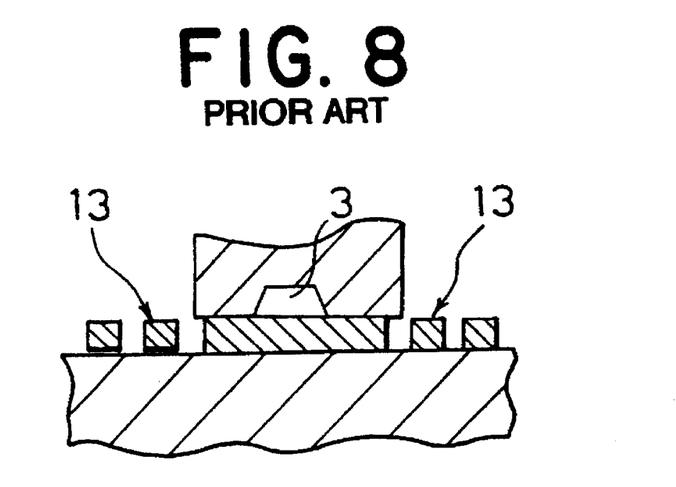
FIG. 8 is a sectional view substantially taken along line 8—8 of FIG. 7 illustrating the lower die and the lead frame together.

FIGS. 7 and 8 are views useful in explaining this abrasion phenomenon, where FIG. 7 is a fragmental plan view of the gate portion of a conventional integral type molding die in which the cavity and the gate are integrally defined and FIG. 8 is a fragmental sectional view taken along line 8—8 of FIG. 7. With this type of integral, one piece molding die, since there is no step or discontinuity in the cross-section of the gate portion, no burr is formed by the leakage of the molten resin. However, it is not possible to replace the gate portion 3 alone when the gate portion 3 is worn. It is to be noted that, although the molding die shown in FIGS. 7 and 8 is different from that shown in FIGS. 5 and 6 in that the latter is a die for manufacturing a semiconductor device having pins on one side or two opposing sides thereof (SIP or DIP) whereas the former is a die for manufacturing a chip having the pins on its four sides thereof (QFP), they are the same as far as the above-discussed abrasion phenomenon of the mold die is concerned.

Accordingly, there has recently been proposed a gate piece type resin encapsulating mold die which allows only the gate portion 3 to be replaced with a fresh piece when the gate piece is worn.

Figure 9:
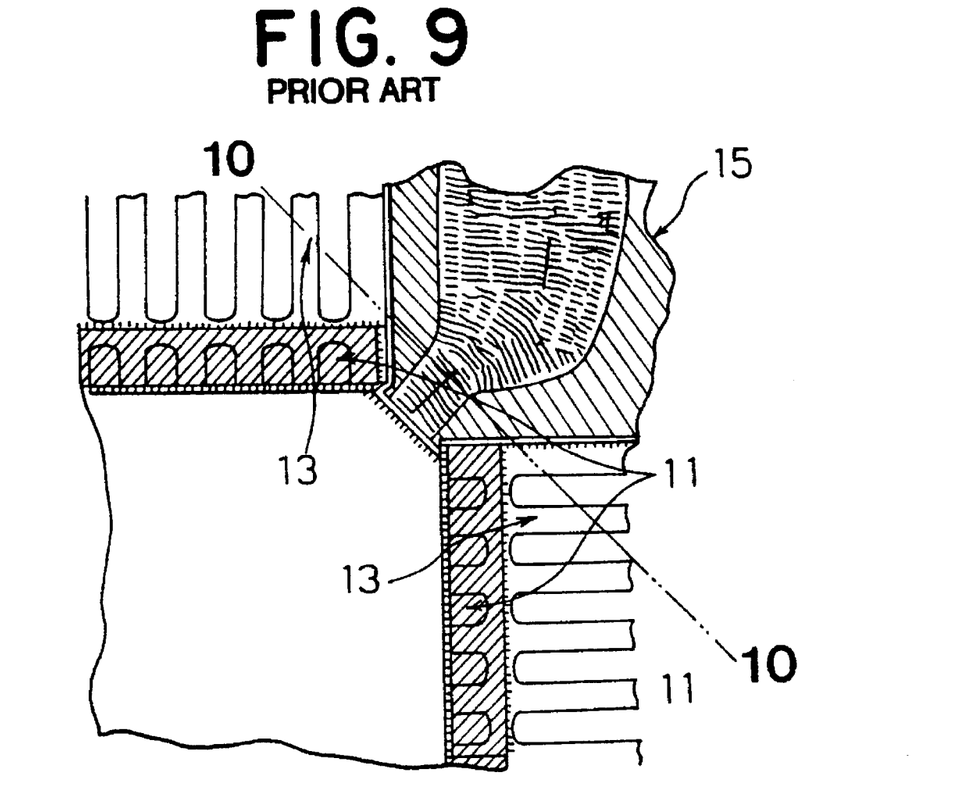
FIG. 9 is a fragmental plan view of the upper die of a conventional resin encapsulating molding die for manufacturing a semiconductor device of the gate piece type in which the cavity piece and the gate piece are formed in separate members.
Figure 10:
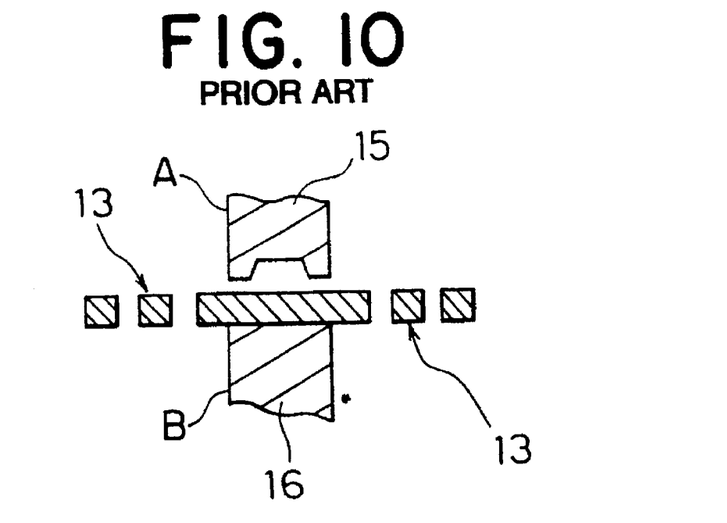
FIG. 10 is a sectional view substantially taken along line 10—10 of FIG. 9 illustrating the upper die and the lead frame together.
Figure 11:
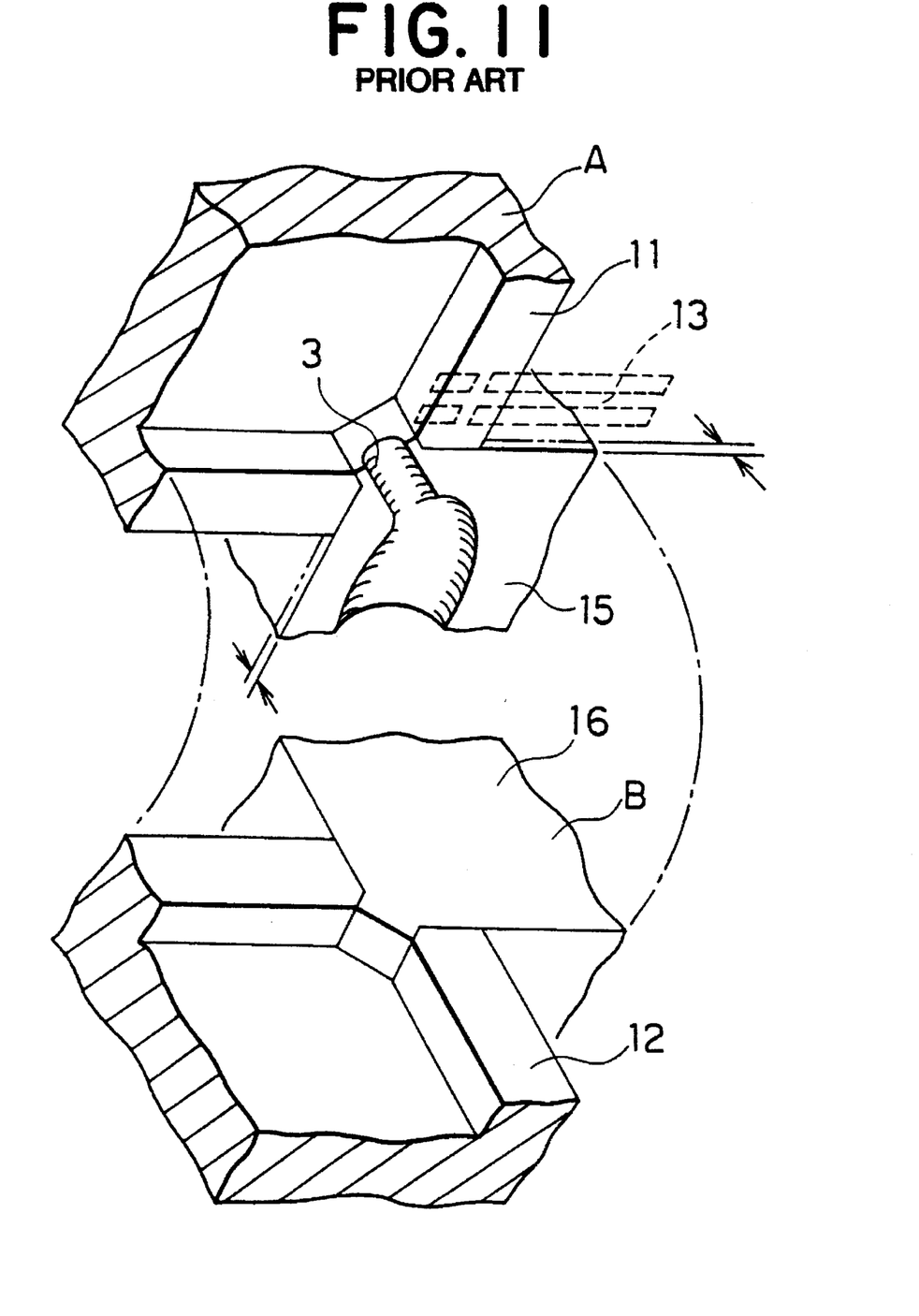
FIG. 11 is a fragmental perspective view of the upper and the lower molding dies of the conventional resin encapsulating molding die for manufacturing a semiconductor device.

FIGS. 9 to 11 illustrate a conventional resin encapsulating molding die of the gate piece type, where FIG. 9 is a fragmental plan view showing a gate piece and a cavity piece, FIG. 10 is a sectional view taken along line 10—10 of FIG. 9 and FIG. 11 is a fragmental perspective view of the conventional gate piece type resin encapsulating mold die. In these figures, the molding die comprises an upper die A and a lower die B which are illustrated in an swung open position for explanation purposes. The upper die A comprises an upper cavity piece 11 having formed therein an upper half of a mold cavity 1 and an upper gate piece 15 intimately fitted to the upper cavity piece 11 at one corner of the mold cavity 1 and having formed therein a gate portion 3 composed of a gate 3a and a sub-runner 3b.

The lower die B is similar to that of the upper die A and comprises a lower cavity piece 12 having formed therein a lower half of the mold cavity 1 and a lower gate piece 16 intimately fitted to the lower cavity piece 12 at the corner of the mold cavity 1. However, the lower gate piece 16 of the lower die B has no gate portion 3. When in use, as shown in dash lines in FIG. 11, a lead frame 1 on which the semiconductor chip 7 is mounted and wire-bonded is placed between the upper and the lower dies A and B and the upper and the lower dies A and B are closed to define a closed space around the semiconductor chip 7 and the wiring as well as the inner leads of the lead frame 1. Then, the molten encapsulating resin may be supplied under pressure through the runner 4 (FIG. 5) and the gate portion 3 within the cavity 1.

In this conventional resin encapsulating molding die of the gate piece type, since the gate portion 3 composed of a gate 3a and a sub-runner 3b is formed as the upper and lower gate pieces 15 and 16 separate from the upper and the lower cavity pieces 11 and 12, only the upper and the lower gate pieces 15 and/or 16 can be easily replaced without changing the larger cavity pieces 11 and 12 when the gate portion 3 of the gate pieces 15 and 16 are worn and damaged.

With the conventional resin encapsulating molding die of the gate piece type, however, a discontinuity or a step may quite easily be formed, due to machining and assembly tolerances, between the upper and the gate pieces 15 and 16 or between the mating surfaces of the cavity piece and the gate piece for sealing the gate runner portion 3 and the cavity piece 11 and 12 for sealing the outer periphery of the semiconductor package, so that a gap may be present between the upper and the lower gate pieces 15 and 16 and the lead frame 2 (see FIG. 10), resulting in easy formation of the burr due to the leakage of the molten resin through the gap between the dies.

More particularly, in the conventional gate piece type encapsulating molding die, the upper and the lower gate pieces 15 and 16 are engaged and assembled with the cavity piece as parts separate from the cavity piece, so that a gap which often causes resin burrs is formed between the cavity pieces and the gate piece. Since a molding resin having a low viscosity is being used in recent years for completely and stably encapsulating a small and thin semiconductor element having a fine and complex configuration, the burrs due to the discontinuity formed between the gate piece and the cavity piece are more frequently generated.

Figure 12:
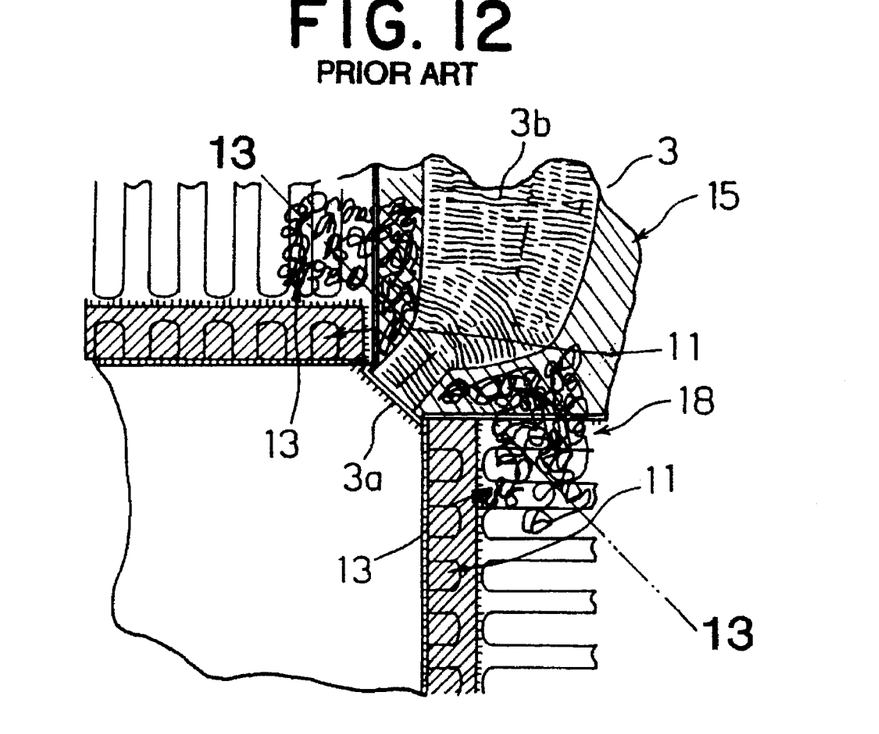
FIG. 12 is a fragmental plan view of the upper die of the resin encapsulating molding die shown in FIGS. 9–11 with the resin burrs formed in the molding die illustrated.
Figure 13:
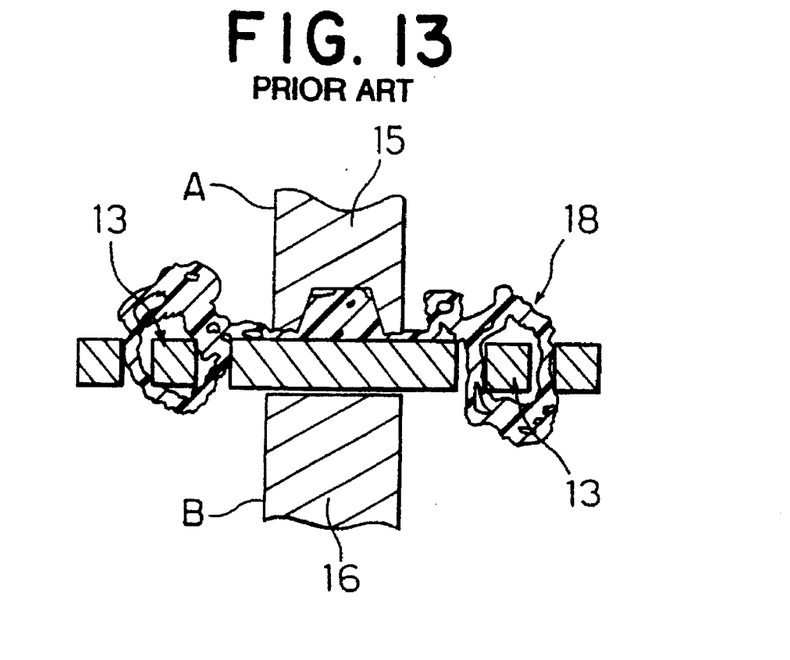
FIG. 13 is a sectional view substantially taken along line 13—13 of FIG. 12 with the lower die and the lead frame illustrated together.

FIGS. 12 and 13 are views for explaining the above problems in more detail, where FIG. 12 is a fragmental plan view showing a resin burr 18 formed when the semiconductor element is resin encapsulated with the molding die shown in FIGS. 9 to 11, and FIG. 13 is a sectional view taken along line 13—13 of FIG. 12. As illustrated, the resin burrs 18 are formed around the outer leads 13 which become outer electrodes of the semiconductor device after resin encapsulation, so that the removal of the resin burrs 18 is very difficult. If the resin burrs 18 cannot be removed, the outer electrodes cannot be properly shaped at the time of the press forming the outer electrodes into a desired configuration after the resin encapsulation of the semiconductor element.

SUMMARY OF THE INVENTION

Accordingly, one object of the present invention is to provide a resin encapsulation molding die for manufacturing a semiconductor device free from the above-discussed problems of the conventional molding die.

Another object of the present invention is to provide a resin encapsulating molding die for manufacturing a semiconductor device in which the generation of resin burrs is prevented.

Another object of the present invention is to provide a resin encapsulating molding die for manufacturing a semiconductor device in which the generation of resin burrs is prevented even when a low viscosity molding resin is used in encapsulating a semiconductor element.

With the above objects in view, the present invention resides in a resin encapsulating molding die for manufacturing a semiconductor device which comprises a cavity piece having a cavity in relation to which a lead frame with a semiconductor element mounted thereon is mounted and a gate piece having a gate portion including a sub-runner through which a resin for encapsulating the semiconductor element is introduced into the cavity, the gate piece being detachable from the cavity piece. The molding die further comprises a sealing dam disposed along the sub-runner for blocking a flow of resin leaking from the sub-runner toward the leads of the lead frame.

The sealing dam may comprise a clamp structure for clamping the leads closely located to the gate of the gate portion, the sealing dam may be a continuous unitary structure of the cavity piece, and the sealing dam may have a parting surface which is at substantially the same level as a parting surface of the cavity piece.

BRIEF DESCRIPTION OF THE DRAWINGS

The present invention will become more readily apparent from the following detailed description of the preferred embodiments taken in conjunction with the accompanying drawings, in which.

DESCRIPTION OF THE PREFERRED EMBODIMENTS

Figure 1:
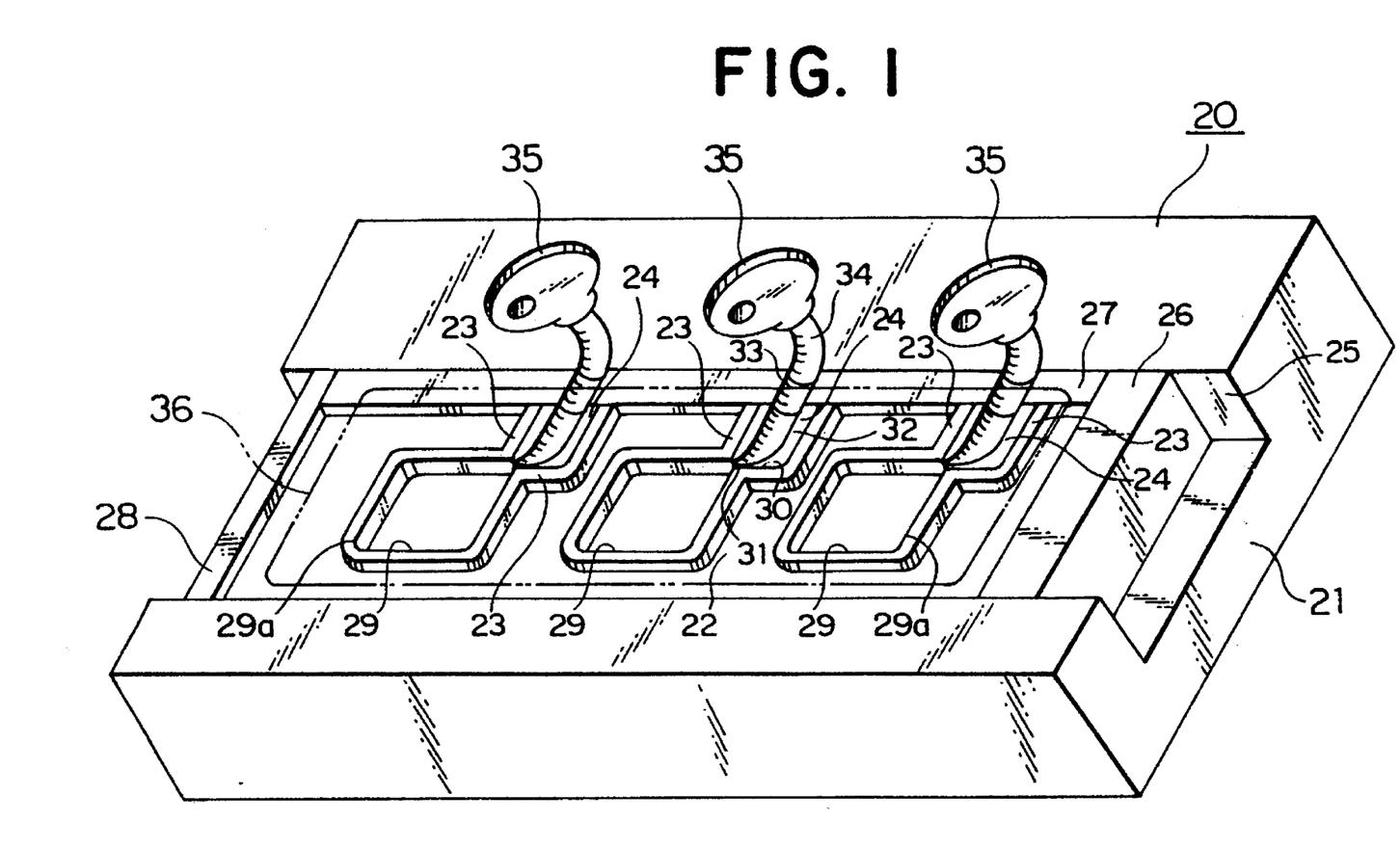
FIG. 1 is a perspective view of an upper molding die of a resin encapsulating molding die for manufacturing a semiconductor device of one embodiment of the present invention.
Figure 2:
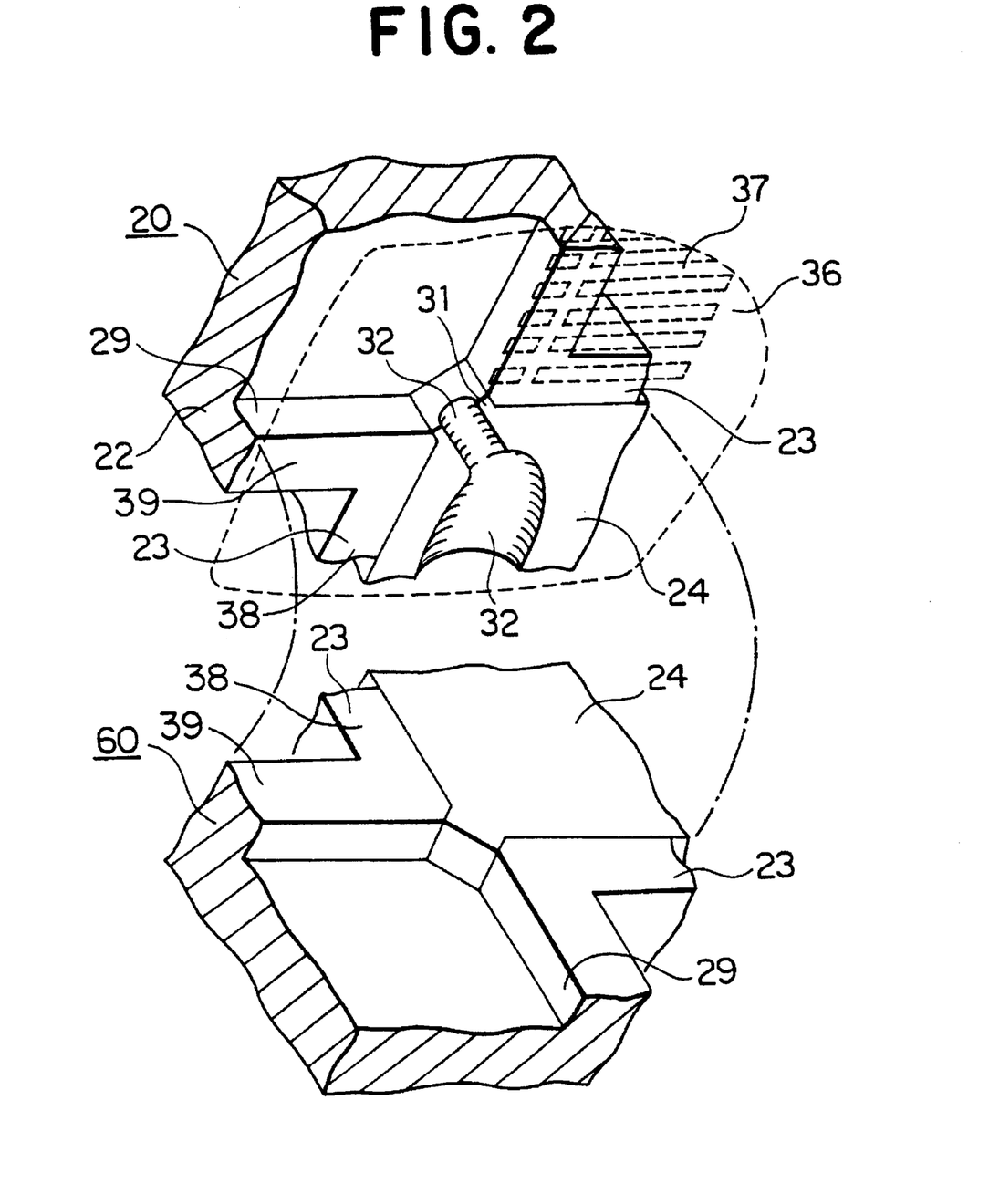
FIG. 2 is a fragmental perspective view of the upper and the lower molding dies of the resin encapsulating molding die for manufacturing a semiconductor device shown in FIG. 1.

FIGS. 1 to 4 illustrate a resin encapsulating molding die for manufacturing a semiconductor device of the present invention which comprises an upper die 20 and a lower die 60 (see FIG. 2) each including base block 21, a cavity piece 22 including two sealing dams 23, and a gate piece 24. While FIG. 1 illustrates an upper die 20 only, the resin encapsulating molding die of the present invention comprises upper and lower dies, the latter may be similar to the upper die 20 except that the runner is not provided as shown in FIG. 2 or the latter may be a conventional one-piece type die.

The upper die 20 shown in FIG. 1 comprises a base block 21 having a groove 25 within which the cavity piece 22 and the gate piece 24 are installed and held in position by means of support members 26, 27 and 28 fitted within the groove 25 of the cavity piece 22 around the cavity piece 22. The cavity piece 22 has formed therein three mold cavities 29 in which semiconductor chips are placed and the encapsulating resin fills. Each mold cavity 29 is defined by a cavity wall 29a having an inner surface, and outer surface, and an upper surface. Each cavity wall 29a has two ends which oppose one of the gate pieces 24. The cavity piece 22 also has formed therein three notches 30 in communication with respective corners of each mold cavity 29 for accommodating the gate piece 24, which has formed therein a gate portion 31 including a sub-runner 32. Each of the sub-runners 32 is connected to a groove 33 provided in the support member 27 which is further connected through a groove 34 to a runner 35 provided in the base block 21 from which molten encapsulating resin is supplied.

Thus, a lead frame 36 with semiconductor elements (not shown) mounted thereon may be placed on the molding die with each semiconductor element positioned within a mold cavity 29. The resin for encapsulating the semiconductor element can be introduced into the cavities 29 through gate pieces 24 having the gate portion 31 including the sub-runner 32. The gate pieces 24 are detachable from the notches 30 of the cavity piece 22.

Figure 3:
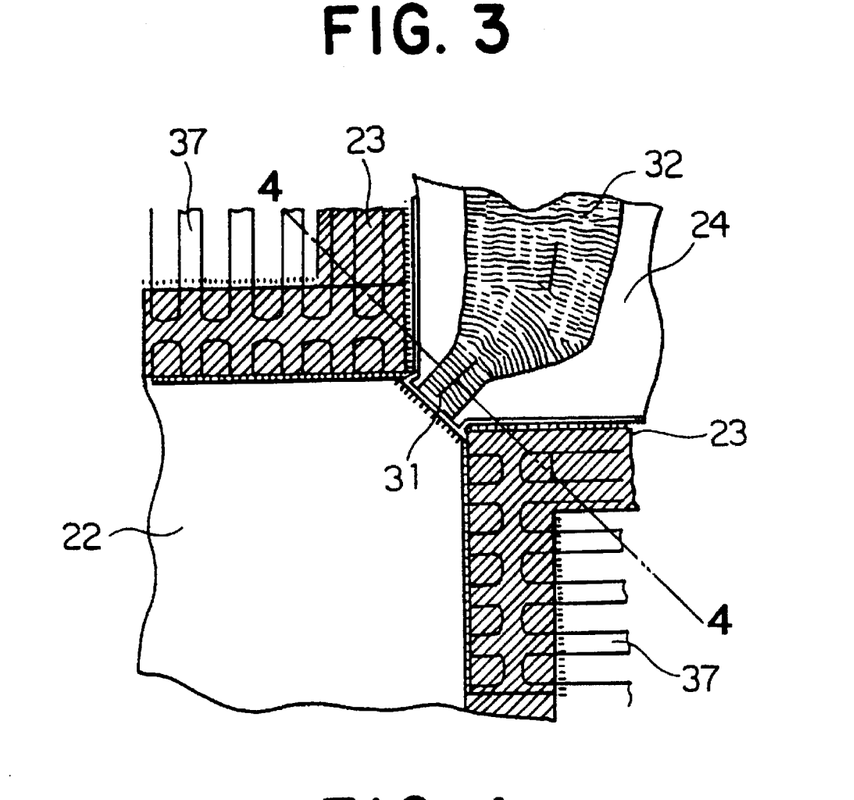
FIG. 3 is a fragmental plan view of the upper die of the resin encapsulating mold die for manufacturing a semiconductor device shown in FIG. 2.
Figure 4:
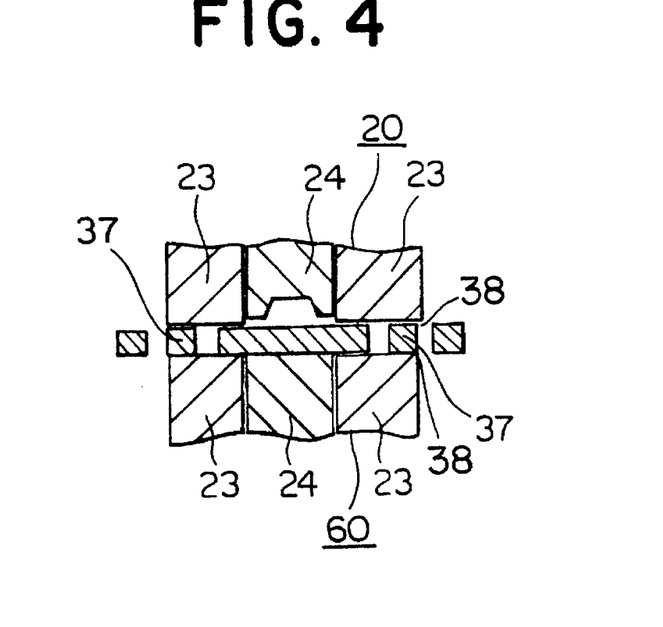
FIG. 4 is a fragmental sectional view of the upper and the lower dies with a lead frame interposed therebetween and substantially taken along line 4—4 of FIG. 3.

As shown in FIGS. 2 to 4 which illustrate the details of the upper die 20 and the lower die 60 of the mold die of the present invention, the cavity piece 22 comprises two sealing dams 23 disposed along the sub-runner 32 of the gate piece 24 for blocking a flow of molten resin leaked from the sub-runner 32 toward leads 37 of the lead frame 36. As best seen in FIG. 4, the upper surfaces 38 of the sealing dams 23 comprise a clamp structure for clamping the leads 37 located close to the gate of the gate portion 31. In the illustrated embodiment, each sealing dam 23 is a continuous unitary structure or an extension of the cavity piece 22 extending along the sides of the gate piece 24 or along the sub-runner 32. The upper surface 38 of each sealing dam 23 is at substantially the same level as the upper surface 39 of the cavity wall 29a. The sealing dams 23 extend to the periphery of the cavity piece 22 and define spaces in which the gate pieces 24 are detachably received.

In other words, the resin sealing dams 23 are disposed along or in parallel to the molten resin introducing path or the sub-runner 32 formed in the gate piece 24, and the sealing dams 23 are integral with the cavity piece 21 including the cavity 1. Also, the height of the sealing dam 23 in the direction of its cross section is in substantially the same plane as the height of the cavity walls 29a in the direction of its cross section.

The sealing dams 23 are also arranged to clamp the lead 37 located closest to the gate portion 31 so that the molten resin leaked from the gate portion 31 is blocked at the clamped lead 37, whereby the molten resin cannot surround leads 37 as the burrs. Also, since the lead frame 36 can be firmly clamped between this cavity piece 22 and the resin sealing dam 23 in the arrangement, the molten resin does not pass through the sealing dam 23 even when a high injection pressure is applied to the molten resin.

Also, when the resin sealing dams 23 are disposed to overlap the flat surface of the lead frame 36 in which the sub-runner 32 extends, the molten resin is reliably prevented from reaching the outer leads 37.

Further, since the travel distance of the leaked molten resin or the length of the resin burr is less than 3 mm for commonly used resin, the present invention is particularly useful when it is applied to the manufacture of a semiconductor device having a distance dimension equal to or less than 3 mm between the sub-runner 32 and the outer lead 37 located most closely to the gate portion 31. Also, the present invention is particularly useful when used in encapsulating a semiconductor device with a resin having a minimum molten consistency or viscosity equal to or less than 600 poise which easily forms resin burrs.

As has been described, the resin encapsulating molding die for manufacturing a semiconductor device of the present invention comprises a cavity piece having a cavity in relation to which a lead frame with a semiconductor element mounted thereon is placed and a gate piece having a gate portion including a sub-runner through which a resin for encapsulating the semiconductor element is introduced into the cavity, the gate piece being detachable from the cavity piece. The resin encapsulating molding die further comprises a sealing dam disposed adjacent the sub-runner for blocking a flow of resin leaked from the sub-runner toward the leads of the lead frame. Therefore, the molten resin leaked from the sub-runner is restricted to flow toward the leads and resin burrs are prevented from forming on the leads.

The sealing dam may comprise a clamp structure for clamping the leads located close to the gate of the gate portion, the sealing dam may be a continuous unitary structure of the cavity piece, and the sealing dam may have a parting surface which is at a substantially same level as a parting surface of the cavity piece. Therefore, resin burrs can be more effectively prevented from being formed on the leads or the molding die can be made less expensive.

What is claimed is:

1. A resin encapsulating molding die for manufacturing a semiconductor device comprising:

a cavity piece having a cavity wall defining a cavity for receiving a semiconductor element mounted on a lead frame, the cavity wall having an inner surface and a top surface;

a gate piece detachably mounted on the cavity piece adjoining the cavity and having a gate portion including a sub-runner for introducing a molten resin for encapsulating the semiconductor element into the cavity; and a first sealing dam extending transversely from the cavity wall along a first side of the gate piece for blocking flow of molten resin from the sub-runner toward leads of the lead frame.

2. The molding die as claimed in claim 1 wherein the first sealing dam has an upper surface for clamping a lead of the lead frame located closest to the gate portion.

3. The molding die as claimed in claim 1 wherein the first sealing dam is integral with the cavity wall.

4. The molding die as claimed in claim 1 wherein the first sealing dam has an upper surface substantially coplanar with the upper surface of the cavity wall.

5. The molding die as claimed in claim 2 wherein the first sealing dam is integral with the cavity wall.

6. The molding die as claimed in claim 2 wherein the upper surface of the first sealing dam is substantially coplanar with the upper surface of the cavity wall.

7. The molding die as claimed in claim 4 wherein the first sealing dam is integral with the cavity wall.

8. The molding die as claimed in claim 5 wherein the upper surface of the first sealing dam is substantially coplanar with the upper surface of the cavity wall.

9. The molding die as claimed in claim 1 wherein the sealing dam extends along an entire length of the sub-runner.

10. The molding die as claimed in claim 1 including a second sealing dam extending transversely from the cavity wall along a second side of the gate piece.

11. The molding die as claimed in claim 10 wherein the cavity is rectangular and the first and second sealing dams extending from a corner of the cavity.

12. The molding die as claimed in claim 10 wherein each of the sealing dams extends to an outer periphery of the cavity piece.

13. The molding die as claimed in claim 10 wherein the cavity wall has first and second ends which oppose the gate piece and the first and second sealing dams adjoin the first and second ends of the cavity wall, respectively.

14. A resin encapsulating molding die comprising:

a cavity piece including a cavity wall defining a cavity for receiving a semiconductor element mounted on a lead frame and first and second sealing dams defining a space communicating with an interior of the cavity for receiving a gate piece, the cavity wall having an inner surface and an upper surface, the first and second sealing dams each extending transversely from the cavity wall and having an upper surface substantially coplanar with the upper surface of the cavity wall; and a gate piece detachably received in the space defined by the sealing dams and having a sub-runner communicating with the interior of the cavity for introducing a molten resin into the cavity, the first and second sealing dams extending along first and second sides of the gate piece for blocking flow of molten resin from the sub-runner toward leads of the lead frame.

* * * * *